US008036042B2

(12) United States Patent  
Kim et al.

(10) Patent No.: US 8,036,042 B2
(45) Date of Patent: Oct. 11, 2011

(54) METHOD OF OPERATING NONVOLATILE MEMORY DEVICE

(75) Inventors: Byung Ryul Kim, Seoul (KR); Duck Ju Kim, Gyeonggi-do (KR); You Sung Kim, Seoul (KR); Se Chun Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 105 days.

(21) Appl. No.: 12/650,740

(22) Filed: Dec. 31, 2009

(65) Prior Publication Data

US 2010/0302864 A1 Dec. 2, 2010

(30) Foreign Application Priority Data

May 29, 2009 (KR) .................. 10-2009-0047820

(51) Int. Cl.
*G11C 16/06* (2006.01)
(52) U.S. Cl. ......... 365/185.22; 365/185.14; 365/185.28; 365/185.12; 365/185.11
(58) Field of Classification Search ............ 365/185.22, 365/185.14, 185.28, 185.12, 185.11
See application file for complete search history.

(56) References Cited

U.S. PATENT DOCUMENTS 7,889,551 B2 * 2/2011 Yang et al. ............... 365/185.03

FOREIGN PATENT DOCUMENTS

KR 1020090048130 5/2009

OTHER PUBLICATIONS

Notice of Allowance issued from Korean Intellectual Property Office on Nov. 30, 2010.

* cited by examiner

*Primary Examiner* — Thong Q Le
(74) *Attorney, Agent, or Firm* — IP & T Group LLP

(57) ABSTRACT

A method of operating a nonvolatile memory device includes performing a reset operation for setting a level of a program voltage to a first level, performing a program operation and a verification operation on memory cells included in a first page of a first memory block while raising the program voltage from the first level, storing a level of the program voltage, supplied to the first page when memory cells programmed to have threshold voltages with at least a verification voltage are detected during the verification operation, as a second level, while raising the program voltage from the second level, performing the program operation and the verification operation on each of second to last pages of the first memory block, and after completing the program operation for the first memory block, performing the reset operation for setting the level of the program voltage to the first level.

9 Claims, 8 Drawing Sheets

FIG. 1
LSB PGM
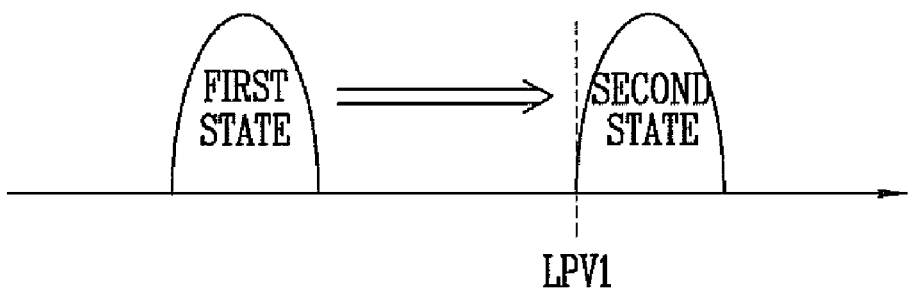
LPV1
MSB PGM
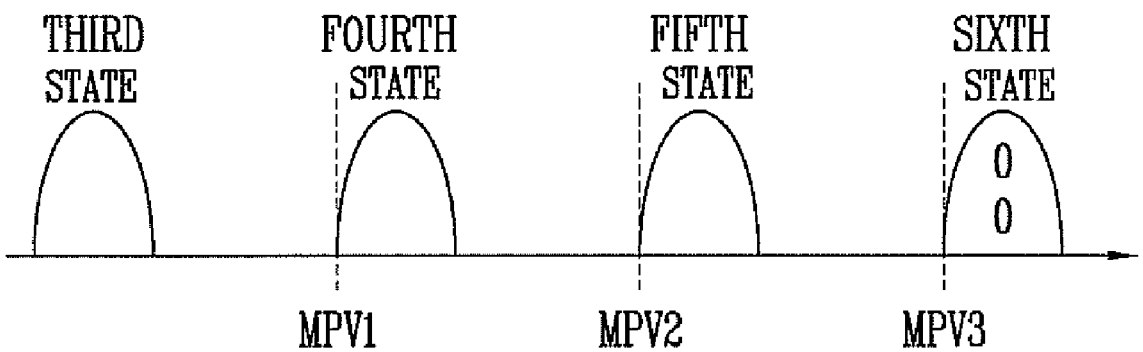
MPV1  MPV2  MPV3

METHOD OF OPERATING NONVOLATILE
MEMORY DEVICE

CROSS-REFERENCE TO RELATED APPLICATIONS

Priority to Korean patent application number 10-2009-0047820 filed on May 29, 2009, the entire disclosure of which is incorporated by reference herein, is claimed.

BACKGROUND OF THE INVENTION

Exemplary embodiments of the present invention relate to a method of operating a nonvolatile memory device.

In recent years, there is an increasing demand for nonvolatile memory devices which can be electrically programmed and erased and which do not require the refresh function of rewriting data at specific intervals.

During a program operation on a nonvolatile memory cell, a verification operation is performed for checking whether a target program cell has been programmed with more than a verification voltage. If the program operation has been performed using a single level cell (SLC) program method, a single verification voltage is used because one page includes cells with only two different states. However, if the program operation has been performed using a multi-level cell (MLC) program method, a number of verification voltages are used because one page includes cells having several states. For example, when the program operation has been performed using a 2-bit MLC program method, if an MSB program operation is performed, verification operations are performed using three kinds of verification voltages. In this case, according to an incremental step pulse program (ISPP) method, after one pulse is supplied, three verification operations need to be performed.

If the program operation has been performed using the MLC program method as described above, memory cells have a number of distributions of the threshold voltages. Accordingly, it is desirable for technology to improve the distribution characteristics of the threshold voltages. Furthermore, in the ISPP method, after one pulse has been supplied, it is inefficient to perform a number of verification operations. Accordingly, it is desirable to reduce such inefficiency.

SUMMARY OF THE INVENTION

Exemplary embodiments of the present invention relate to a method of operating a nonvolatile memory device, which improves the efficiency of a program operation and a verification operation performed on the nonvolatile memory device.

A method of operating a nonvolatile memory device according to an embodiment of the present invention includes performing a reset operation for setting a level of a program voltage to a first level, performing a program operation and a verification operation on memory cells included in a first page of a first memory block while raising the program voltage from the first level, storing a level of the program voltage, supplied to the first page when memory cells programmed to have threshold voltages with at least a verification voltage have been detected during the verification operation, and, while raising the program voltage from a second level, performing the program operation and the verification operation on each of second to last pages of the first memory block, and after completing the program operation for the first memory block, performing the reset operation for setting the level of the program voltage to the first level to perform the program operation on pages included in a second memory block.

The method further includes performing the program operation and the verification operation for the pages of the second memory block while raising the program voltage from the first level after performing the reset operation for setting the level of the program voltage to the first level to perform the program operation on pages included in a second memory block.

Performing the reset operation for setting the level of the program voltage to the first level in order to perform the program operation on pages included in a second memory block includes determining whether the program operation for the first memory block has been completed, and, in response to the program operation for the first memory being determined to have been completed, determining whether the program operation will be performed on the second memory block, and, in response to the program operation being determined to have been performed on the second memory block, setting the level of the program voltage to the first level.

Performing the reset operation for setting the level of the program voltage to the first level in order to perform the program operation on pages included in a second memory block includes loading a memory block address of an old page, loading a memory block address of a new page, comparing the memory block address of the old page to the memory block address of the new page, and, in response to the memory block address of the old page and the memory block address of the new page differing from each other, completing the program operation for the first memory block and setting the level of the program voltage to the first level to perform the program operation for the second memory block.

The method further includes continuing to perform the program operation for the first memory block in response to the memory block address of the old page being identical to the memory block address of the new page.

Comparing the memory block address of the old page to the memory block address of the new page includes performing a subtraction operation for finding a difference between the memory block address of the old page and the memory block address of the new page, and generating a flag signal according to a result of the subtraction operation.

The flag signal indicates whether the memory block address of the old page is identical to the memory block address of the new page.

The method further includes completing the program operation for the first memory block and setting the level of the program voltage to the first level to perform the program operation for the second memory block in response to the flag signal indicating that the memory block address of the old page differs from the memory block address of the new page.

The method further includes continuing to perform the program operation for the first memory block in response to the flag signal indicating that the memory block address of the old page is identical to the memory block address of the new page.

BRIEF DESCRIPTION OF THE DRAWINGS

FIG. 1 is a diagram illustrating an MLC program method for a nonvolatile memory device;

DESCRIPTION OF EMBODIMENTS

Figure 2:
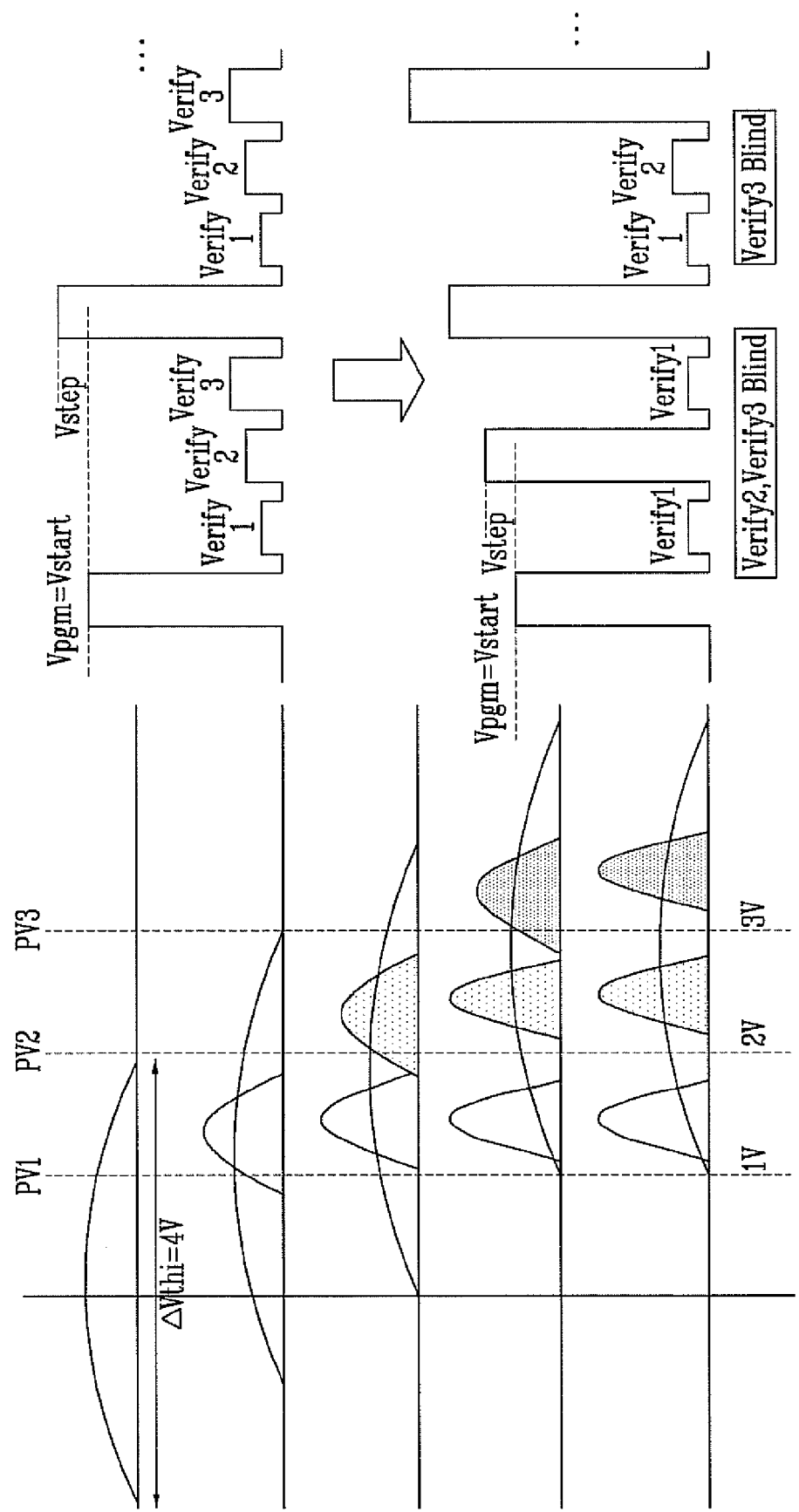
FIG. 2 is a diagram illustrating the concept of a blind verification method for a nonvolatile memory device.

Hereinafter, embodiments of the present invention are described in detail with reference to the accompanying drawings. The drawing figures are provided to allow those having ordinary skill in the art to understand the scope of the embodiments of the present invention.

FIG. 1 is a diagram illustrating an MLC program method for a nonvolatile memory device.

In a least significant bit (LSB) program operation, the threshold voltages of cells have two different distributions. That is, it is assumed that a distribution of the threshold voltages of cells, programmed to have at least a verification voltage LPV1, is called a second state, and a distribution of the threshold voltages of cells, programmed to be less than the verification voltage LPV1, is called a first state.

As described above, in the state in which the LSB program operation has been performed, a most significant bit (MSB) program operation is performed. Through the MSB program operation, the threshold voltages of cells have four different distributions (i.e., third to sixth states). Verification voltages used in the MSB program operation are different in their respective distributions. That is, the verification voltages can include a first verification voltage MPV1, a second verification voltage MPV2, and a third verification voltage MPV3 in the order of a lower verification voltage. A state in which cells are programmed to have threshold voltages with at least the third verification voltage MPV3 is called a sixth state. A state in which cells are programmed to have threshold voltages which are less than the third verification voltage MPV3, but are at least the second verification voltage MPV2 is called a fifth state. A state in which cells are programmed to have threshold voltages with less than the second verification voltage MPV2, but are at least the first verification voltage MPV1 is called a fourth state. A state in which cells are programmed to have threshold voltages with less than the first verification voltage MPV1 is called a third state. Furthermore, cells to be programmed to have the fourth state are defined to be first target verification cells, cells to be programmed to have the fifth state are defined to be second target verification cells, and cells to be programmed to have the sixth state are defined to be third target verification cells.

As described above, verification operations in the MSB program operation have to be performed on the basis of more verification voltages than verification operations in the LSB program operation.

FIG. 2 is a diagram illustrating the concept of a blind verification method for a nonvolatile memory device.

The blind verification method is applied to an MLC program method. FIG. 2 illustrates a verification method when a 2-bit MLC program method is performed. Verification operations are performed on the basis of a total of three verification voltages PV1, PV2, and PV3. Since the verification operations are respectively performed on the basis of the three verification voltages, three verification operations, in principle, have to be performed after one program pulse is supplied.

However, as described above, a program start voltage is set on the basis of a state in which the threshold voltage is the lowest. Thus, when a first program pulse is supplied, there are no cells programmed to have threshold voltages with the second verification voltage PV2 or at least the third verification voltage PV3. In other words, after several program pulses are supplied, cells are programmed to have threshold voltages with the second verification voltage PV2 and at least the third verification voltage PV3. Accordingly, to reduce the time that it takes to perform the verification operations, during the first several periods, only verification operations based on the first verification voltage are performed after a program pulse has been supplied. The blind verification method has originated because some of the verification operations are omitted, as described above. If a method of supplying a program pulse is used by taking a change in the program speed into consideration, depending on the number of program/erase verification operations, in addition to the concept of such a blind verification method, the following problems occur.

Figure 3:
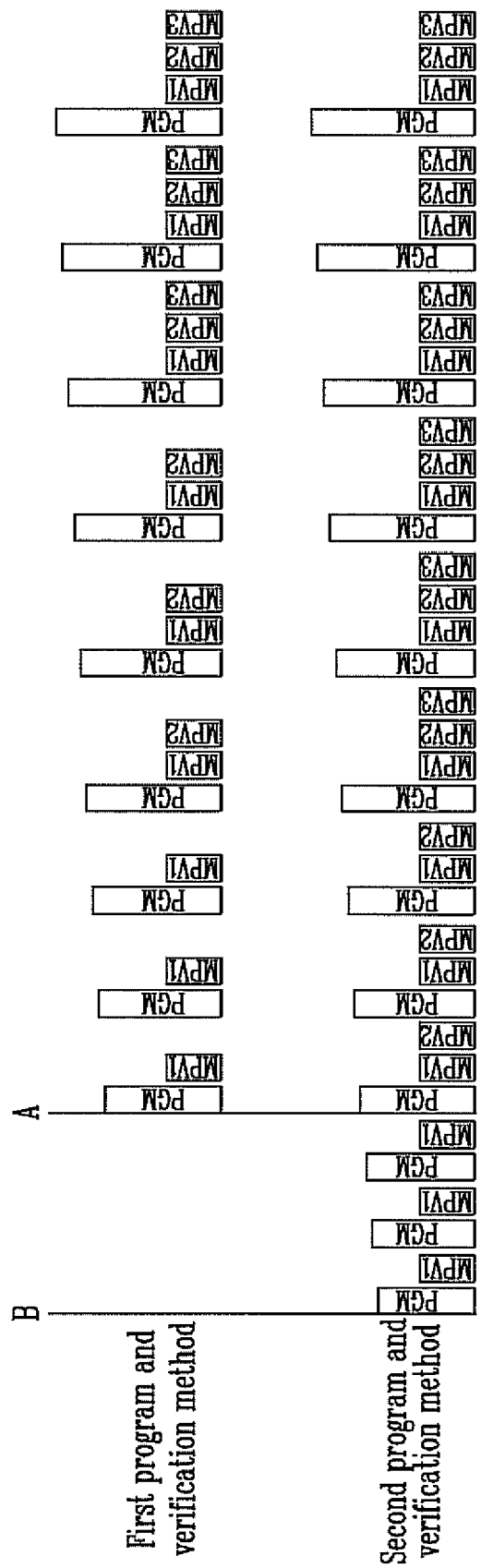
FIG. 3 is a diagram illustrating a method of verifying an MSB program operation performed on a nonvolatile memory device.

FIG. 3 is a diagram illustrating a method of verifying an MSB program operation performed on a nonvolatile memory device.

In a first program verification method, after a first program voltage is supplied according to the blind verification method, only a verification operation based on the first verification voltage MPV1 is performed. Although the verification operations based on the second verification voltage MPV2, the third verification voltage MPV3, etc. have to be performed in principle, only the verification operation based on the first verification voltage MPV1 is performed according to the blind verification method.

After a program pulse is supplied and only the verification operation based on the first verification voltage MPV1 is performed about three times, the verification operations based on not only the first verification voltage MPV1, but also the second verification voltage MPV2 are also performed. Furthermore, after the verification operations based on the first and second verification voltages MPV1 and MPV2 are performed about three times, the verification operation based on the third verification voltage MPV3 is performed. The number of times that the verification operation based on only the first verification voltage MPV1 is performed and the number of times that the verification operations based on only the first and second verification voltages MPV1 and MPV2 are performed have been previously set.

A second program verification method is described below. The second program verification method is performed in such a manner that the program start pulse is lowered in order to compensate for a tendency that the program speed is increased according to the number of program/erase operations. That is, as shown in the second program verification method, the program start pulse is lowered and supplied as compared with the first program verification method. However, this method can have problems according to the number of program/erase operations.

In other words, when there many program/erase operations, although a low program pulse is supplied, there is a large shift in the threshold voltage because the program speed is high. Accordingly, although a low program voltage is supplied, a verification operation has to be performed. Furthermore, after a point of time at which some of the threshold voltages rise ("A" in FIG. 3), the verification operations based on the first and second verification voltages MPV1 and MPV2 have to be performed.

However, when there few program/erase operations, when a low program pulse is supplied, a shift in the threshold voltage is small because the program speed is slow. Accordingly, when a low program voltage is supplied, there is less need to perform the verification operation. Furthermore, since an increment of the threshold voltage is small, there is less need to perform even the verification operation based on second verification voltage MPV2 in addition to the verification operation based on the first verification voltage MPV1 after some program pulses have been supplied (that is, after "A").

Figure 4:
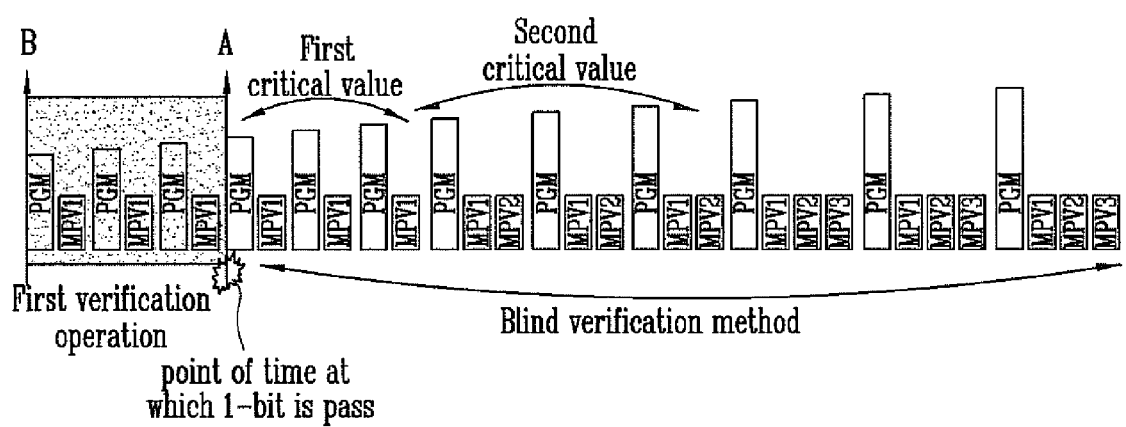
FIG. 4 is a diagram illustrating a method of verifying a nonvolatile memory device.

FIG. 4 is a diagram illustrating a method of verifying a nonvolatile memory device.

Referring to FIG. 4, a low program start voltage is first supplied by taking an increase of the program speed depending on an increase in the number of program/erase operations into consideration. In this state, if the blind verification method is monotonously used, the verification operation based on the second verification voltage MPV2 in addition to the verification operation based on the first verification voltage MPV1 has to be unnecessarily performed in the initial operation in which the number of program/erase operations is small.

To prevent this problem, the blind verification method is used only when cells programmed to have threshold voltages with at least the first verification voltage MPV1 are detected.

In other words, the first verification operation based on the first verification voltage MPV1 and the ISPP program operation are alternately performed until cells programmed to have threshold voltages having at least the first verification voltage MPV1 are detected. The blind verification method is performed right after cells programmed to have threshold voltages with at least the first verification voltage MPV1 have been detected.

A variety of additional schemes are used in the above blind verification method. There is a method of controlling a program voltage. In this method, if, during a program operation on a first page, cells programmed to have threshold voltages with at least the first verification voltage MPV1 are detected, the level of a program voltage at that time is set to a program start voltage for a second page, and the program operation is performed on the basis of the set voltage. In this case, the time that it takes to perform all program operations (tPROG) can be reduced.

However, the program speed becomes fast with an increase in the number of program/erase operations. Thus, if a program voltage is uniformly set, problems arise. Accordingly, in the blind verification method to which the method of controlling a program voltage is applied, a method of lowering the level of a program start voltage by a set level is used.

However, such a method can be problematic if a target memory block for a program is changed. For example, assuming that a program start voltage has been set by performing a program operation on a memory block having a small number of program/erase operations, in the case in which the program operation is performed on another memory block having a large number of program/erase operations, if the same program start voltage is used for the another memory block, an over-program phenomenon in which program-inhibited cells are programmed because of a high level of a program start voltage can occur.

Accordingly, the present invention proposes a method of resetting a program start voltage whenever a memory block is changed.

Figure 5:
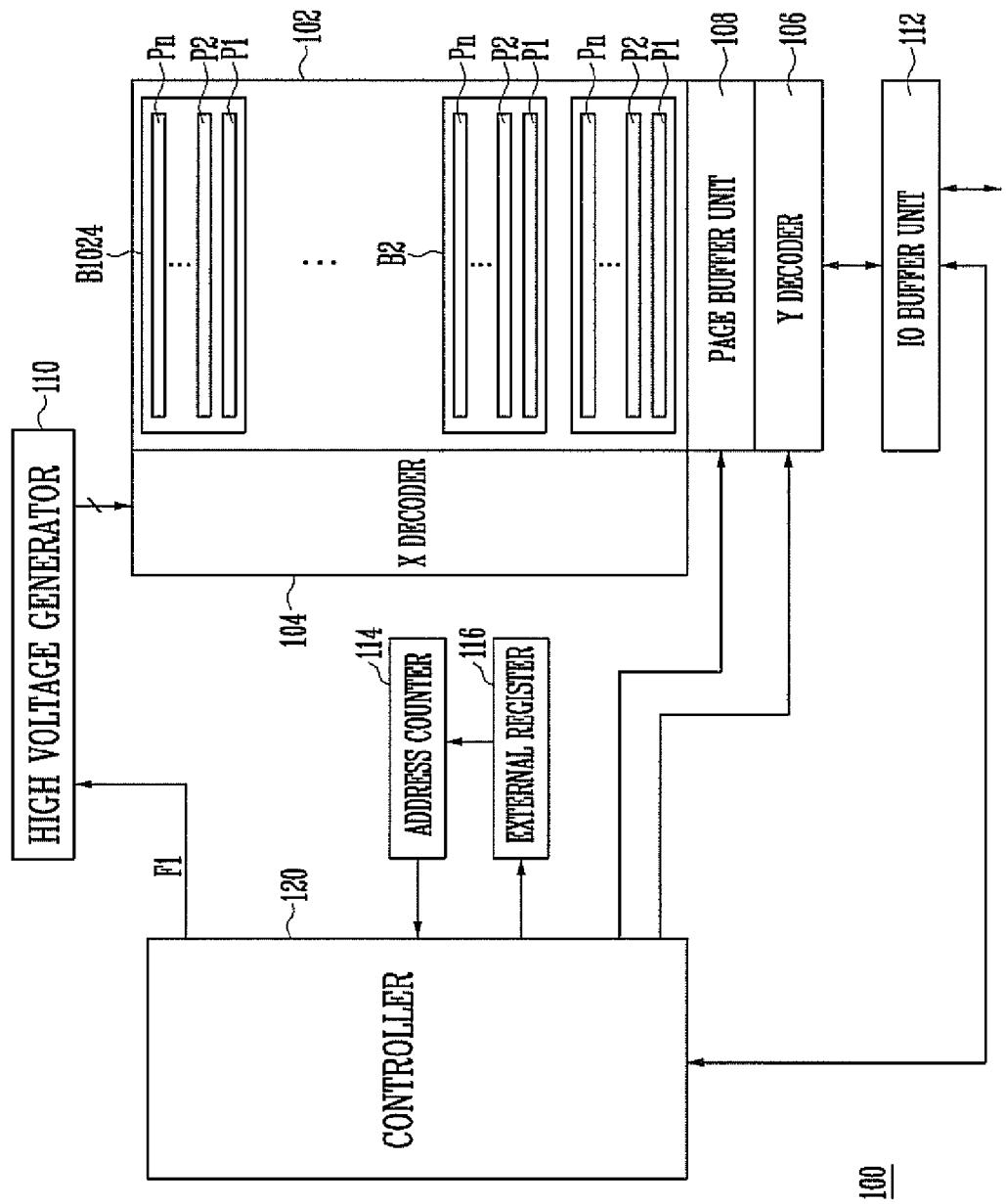
FIG. 5 is a block diagram of a nonvolatile memory device according to an embodiment of the present invention.

FIG. 5 is a block diagram of a nonvolatile memory device according to an embodiment of the present invention.

Referring to FIG. 5, the nonvolatile memory device 100 includes a memory cell array 102, an X decoder 104, a Y decoder 106, a page buffer unit 108, a high voltage generator 110, an IO buffer unit 112, an address counter 114, an external register 116, and a controller 120.

The memory cell array 102 includes a number of memory blocks. In FIG. 5, the memory cell array 102 is illustrated to include 1024 memory blocks B1, B2, . . . , B1024. Each of the memory blocks an n number of pages P1, P2, . . . , Pn.

The controller 120 is configured to control the overall operation of the nonvolatile memory device and to generate a program command signal, an erase command signal, and a read command signal in response to signals transmitted or received via the IO buffer unit 112.

The high voltage generator 110 is configured to generate bias voltages in response to the program command signal, the erase command signal, and the read command signal of the controller 120 and to supply them to the X decoder 104, etc. In this embodiment of the present invention, the high voltage generator 110 controls a bias voltage in response to a flag signal F1 generated by the controller 120 and supplies the controlled bias voltage to the X decoder 104, etc.

The X decoder 104 is configured to supply one of the blocks of the memory cell array 110 with the bias voltages, received from the high voltage generator 110, in response to a row address signal.

The Y decoder 106 is configured to supply a data signal to the page buffer unit 108 in response to a column address signal.

The page buffer unit 108 includes a plurality of page buffers each configured to store the data signal, received via the IO buffer unit 112 and the Y decoder 106, and to output the data signal to bit lines shared by the blocks of the memory cell array 102. Further, each of the page buffers is configured to store data, read from the memory cell array 102, in response to a read operation and then to output the stored data externally via the Y decoder 106 and the IO buffer unit 112.

The address counter 114 is configured to generate and output a memory block address. For example, the address counter 114 can generate a memory block address of 13 bits and output it to the controller 120.

The external register 116 is configured to store the address of a memory block on which a program operation has been performed. For example, the external register 116 can store a memory block address of 13 bits. Furthermore, the external register 116 retains data stored therein until a reset signal is received from the controller 120.

In this embodiment of the present invention, a program voltage is reset whenever a memory block on which a program operation is performed is changed. Detailed elements of the nonvolatile memory device pertinent to such an operation are described below.

Figure 6:
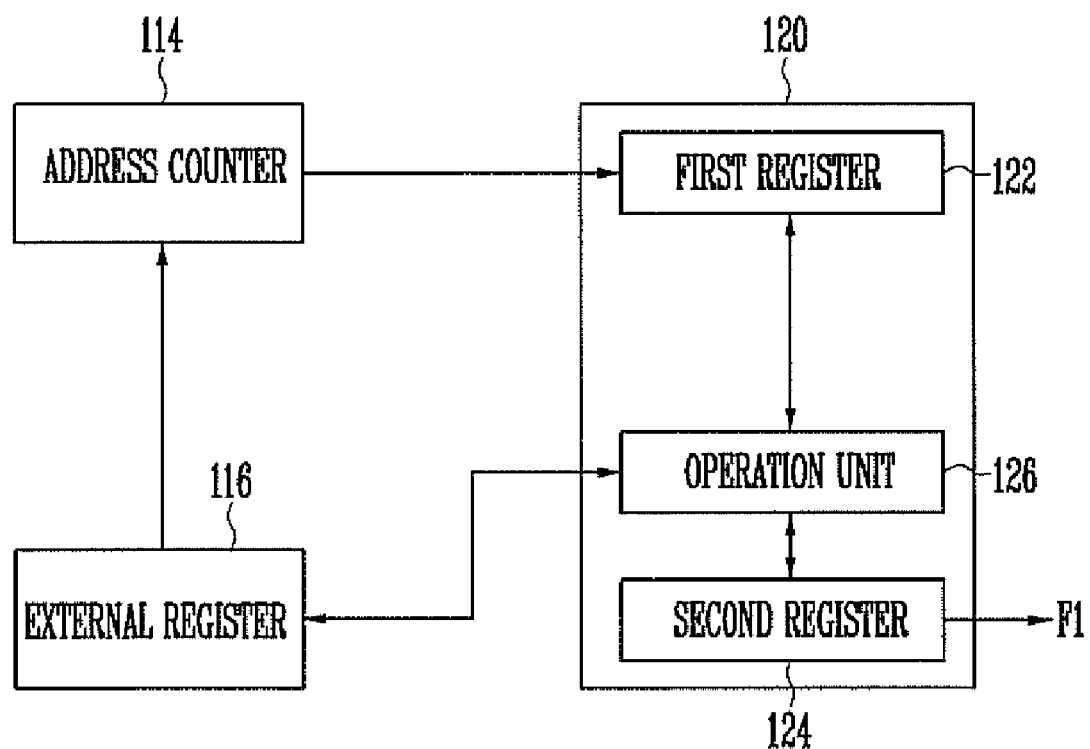
FIG. 6 is a detailed block diagram of the controller, the address counter, and the external register of the nonvolatile memory device according to an embodiment of the present invention.

FIG. 6 is a detailed block diagram of the controller 120, the address counter 114, and the external register 116 of the nonvolatile memory device according to an embodiment of the present invention.

Referring to FIG. 6, the controller 120 includes a first register 122, a second register 124, and an operation unit 126.

The first register 122 is configured to store a memory block address received from the address counter 114.

The second register 124 is configured to store a flag signal F1 outputted from the operation unit 126. The second register 124 is configured to output the flag signal F1 to the high voltage generator 110 (not shown in FIG. 6). The high voltage generator 110 is configured to control a bias voltage in response to the flag signal F1.

The operation unit 126 is configured to compare the memory block address of an old page on which a program operation has been completed, which is stored in the first register 122, to the memory block address of a new page on which a program operation will be performed and to generate the flag signal F1 according to a result of the comparison. In at least one embodiment of the present invention, the operation unit 126 can perform a subtraction operation for comparing the memory block address of an old page and the memory block address of a new page and generate the flag signal F1 according to a result of the subtraction operation. For example, the operation unit 126 can generate the flag signal F1 of 0 or 1 by performing the subtraction operation for the memory block address of an old page and the memory block address of a new page.

Figure 7:
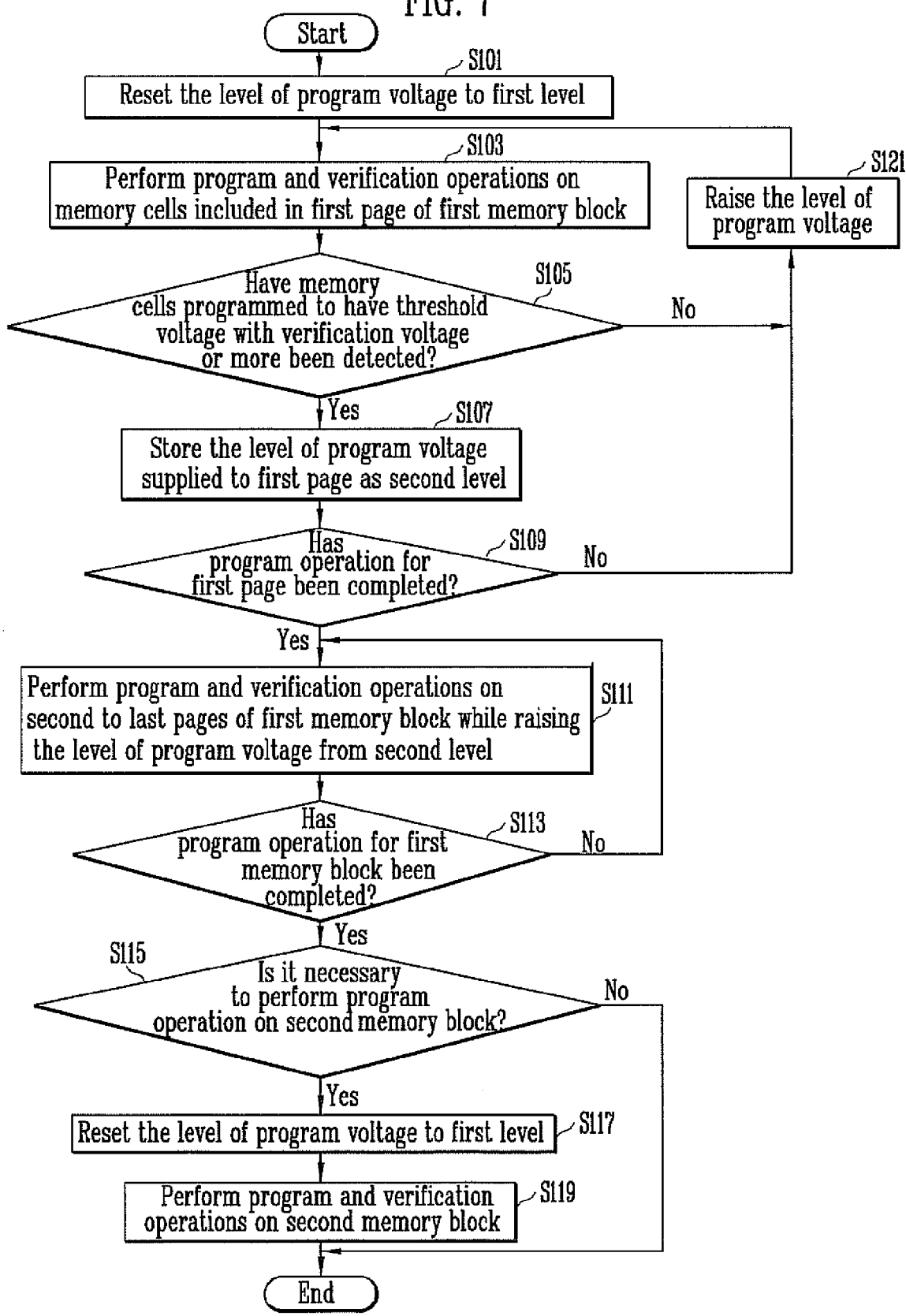
FIG. 7 is a flowchart illustrating a method of operating the nonvolatile memory device according to an embodiment of the present invention.

FIG. 7 is a flowchart illustrating a method of operating the nonvolatile memory device according to an embodiment of the present invention. The flowchart of FIG. 7 is described below with reference to the nonvolatile memory device shown in FIGS. 5 and 6.

A reset operation for resetting the level of a program voltage to a first level is first performed at step S101. The first level corresponds to the level of a program voltage supplied to a first loop when program/verification operations using an ISPP method are performed.

While raising the program voltage from the first level, a program operation and a verification operation are performed on memory cells included in the first page P1 of a first memory block B1 at step S103.

During the verification operation, if at least on of the memory cells, having a threshold voltage higher than a verification voltage, are detected at step S105, the level of the program voltage supplied to the first page P1 is stored as a second level at step S107. For example, the second level can be stored in the internal register of the controller 120.

A determination is then made as to whether the program operation on the first page P1 has been completed at step S109. If, as a result of the determination, the program operation on the first page P1 is determined not to have been completed, the level of the program voltage is raised at step S121, and the steps S103 to S109 are repeatedly performed.

If, as a result of the determination at step S109, the program operation on the first page P1 is determined to have been completed, the level of the program voltage is raised from a second level, and a program operation and a verification operation are performed on the second to last pages of the first memory block B1 at step S111.

A determination is then made as to whether the program operation on the first memory block B1 has been completed at step S113.

If, as a result of the determination, the program operation on the first memory block B1 is determined to have been completed, a determination is then made as to whether the program operation will be performed on a second memory block B2 at step S115.

If, as a result of the determination at step S115, the program operation is determined to be performed on the second memory block B2, the reset operation for resetting the level of the program voltage to the first level is performed in order to perform the program operation on pages included in the second memory block B2 at step S117. The step S117 is described in detail later.

While raising the program voltage from the first level, a program operation and a verification operation are performed on a first page of the pages included in the second memory block B2 using an ISPP method at step 119. The program operation and the verification operation for the second memory block B2 are identical with those for the first memory block B1. Accordingly, the program operation and the verification operation for the second memory block B2 are performed in the same manner as the steps S101 to S121 of the program operation and the verification operation for the first memory block B1.

The step S117 is described in detail below with reference to FIG. 8.

Figure 8:
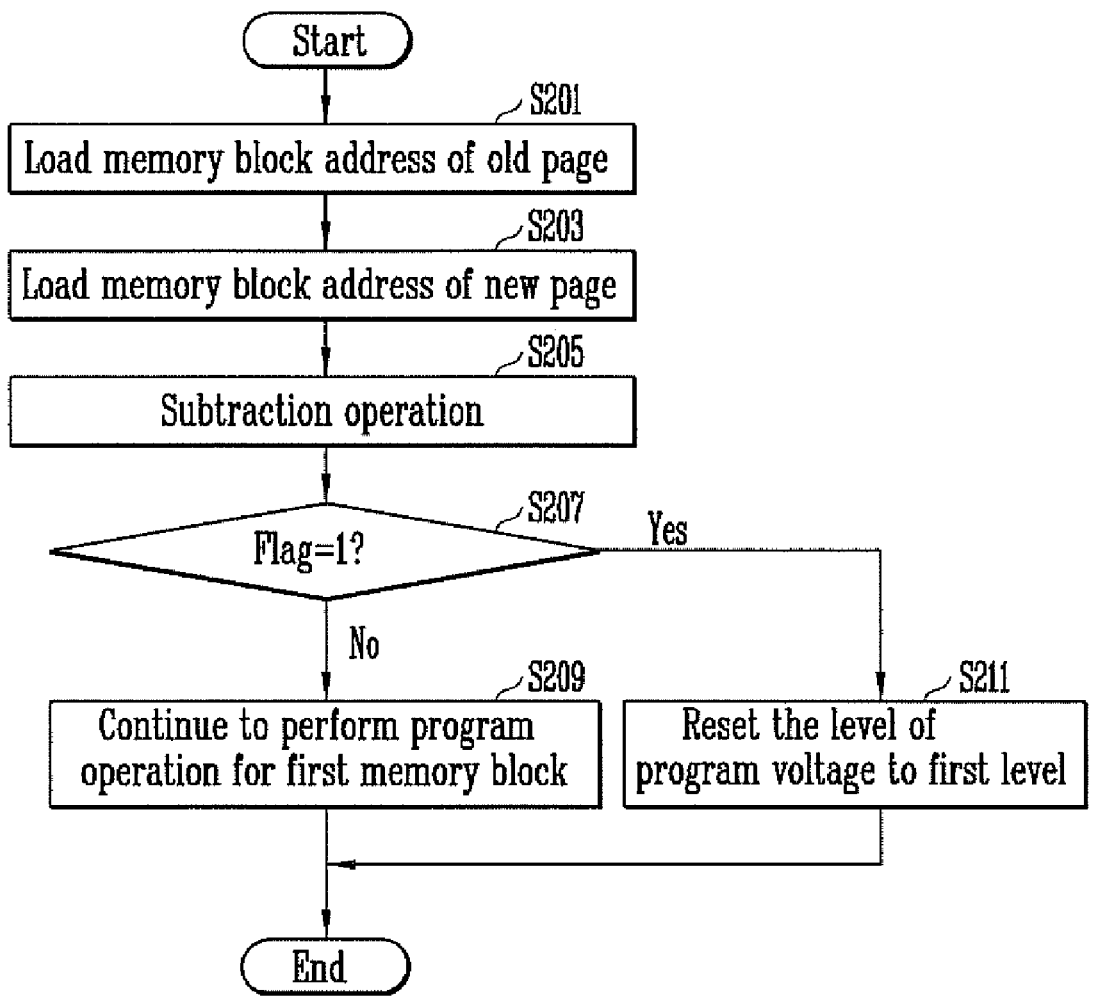
FIG. 8 is a detailed flowchart illustrating one of the processes of the method of operating the nonvolatile memory device according to an embodiment of the present invention.

FIG. 8 is a detailed flowchart illustrating the step S117 of the method of operating the nonvolatile memory device according to an embodiment of the present invention.

Referring to FIG. 8, the step S117 is performed as follows.

First, the memory block address of an old page is loaded in the first register 122 at step S201. The memory block address of the old page refers to the memory block address of a page on which a program operation has been performed. For example, in FIG. 5, an address of the first memory block B1 is loaded on the first register 122.

The memory block address of a new page is loaded on the first register 122 at step S203. The memory block address of the new page refers to the memory block address of a new page on which a program operation will be performed. For example, in FIG. 5, an address of the first memory block B1 or the second memory block B2 is loaded on the first register 122.

The operation unit 126 performs the subtraction operation for comparing the memory block address of the old page and the memory block address of the new page and generates the flag signal F1 depending on a result of the subtraction operation at step S205.

The generated flag signal F1 is stored in the second register 124 and then outputted to the high voltage generator 110. In the present invention, the flag signal F1 is used to indicate whether the memory block address of the old page is identical with the memory block address of the new page. For example, if the memory block address of the old page is identical with the memory block address of the new page, the operation unit 126 can generate the flag signal F1 of '0'. If the memory block address of the old page is not identical with the memory block address of the new page, the operation unit 126 can generate the flag signal F1 of '1'.

A determination is then made as to whether the generated flag signal F1 is '1' at step S207. If, as a result of the determination, the generated flag signal F1 is determined to be '1', the program operation for the first memory block B1 has been completed and the program operation for the new second memory block B2 is started. Accordingly, to perform the program operation on the second memory block B2, the reset operation for setting the level of the program voltage to the first level is performed at step S211. As described above, the flag signal F1 of '1' indicates that the memory block address of an old page differs from the memory block address of a new page. That is, the program operation for the first memory block B1 is completed, and the program operation is newly performed on the second memory block B2. Thus, the high voltage generator 110 that has received the flag signal F1 of '1' resets the program voltage to the first level and supplies the reset program voltage to the X decoder 104.

However, if, as a result of the determination at step S207, the generated flag signal F1 is determined to be '0', the program operation for the first memory block B1 continues. As described above, the flag signal F1 of '0' indicates that the memory block address of an old page is identical with the memory block address of a new page. Accordingly, the program operation is continuously performed on the pages of the first memory block B1 at step S209.

According to an embodiment of the present invention, if the memory block of a nonvolatile memory device is changed during a program operation, a program voltage is reset. Accordingly, the time that it takes to perform all program operations is reduced. In particular, when the blind verification operation is performed in an MLC program method, an over-program phenomenon is prevented. Accordingly, the time that it takes to perform all program operations is effectively reduced.

What is claimed is:

1. A method of operating a nonvolatile memory device, the method comprising:
    performing a reset operation for setting a level of a program voltage to a first level;
    performing a program operation and a verification operation on memory cells included in a first page of a first memory block while raising the program voltage from the first level;
    storing a level of the program voltage, supplied to the first page when at least one of the memory cells, having a threshold voltage higher than a verification voltage, occurs, as a second level;
    performing the program operation and the verification operation on last pages of the first memory block while raising the program voltage from the second level; and
    performing the reset operation for setting the initial level of the program voltage to the first level to perform the program operation on pages included in a second memory block after completing the program operation for the first memory block.

2. The method of claim 1, further comprising performing the program operation and the verification operation for the pages of the second memory block while raising the program voltage from the first level after performing the reset operation for setting the level of the program voltage to the first level to perform the program operation on pages included in a second memory block.

3. The method of claim 1, wherein performing the reset operation for setting the level of the program voltage to the first level to perform the program operation on pages included in a second memory block comprises:
    determining whether the program operation for the first memory block has been completed;
    determining whether the program operation will be performed on the second memory block in response to the program operation for the first memory being determined to have been completed; and
    setting the level of the program voltage to the first level in response to the program operation being determined to have been performed on the second memory block.

4. The method of claim 1, wherein performing the reset operation for setting the level of the program voltage to the first level to perform the program operation on pages included in a second memory block comprises:
    loading a memory block address of an old page;
    loading a memory block address of a new page;
    comparing the memory block address of the old page to the memory block address of the new page; and
    completing the program operation for the first memory block and setting the level of the program voltage to the first level to perform the program operation for the second memory block in response to the memory block address of the old page differing from the memory block address of the new page.

5. The method of claim 4, further comprising continuing to perform the program operation for the first memory block in response to the memory block address of the old page being identical to the memory block address of the new page.

6. The method of claim 4, wherein comparing the memory block address of the old page with the memory block address of the new page comprises:
    performing a subtraction operation for finding a difference between the memory block address of the old page and the memory block address of the new page; and
    generating a flag signal according to a result of the subtraction operation.

7. The method of claim 6, wherein the flag signal indicates whether the memory block address of the old page is identical to the memory block address of the new page are identical.

8. The method of claim 7, further comprising completing the program operation for the first memory block and setting the level of the program voltage to the first level to perform the program operation for the second memory block in response to the flag signal indicating that the memory block address of the old page differs from the memory block address of the new page.

9. The method of claim 7, further comprising continuing to perform the program operation for the first memory block in response to the flag signal indicating that the memory block address of the old page is identical to the memory block address of the new page.

* * * * *